(12) United States Patent
Wrosch et al.

(10) Patent No.: US 7,888,411 B2
(45) Date of Patent: Feb. 15, 2011

(54) THERMALLY CONDUCTIVE ADHESIVE COMPOSITION AND PROCESS FOR DEVICE ATTACHMENT

(75) Inventors: Matthew Wrosch, San Diego, CA (US); Miguel Albert Capote, Carlsbad, CA (US); Janet Fox, legal representative, Carlsbad, CA (US); Alan Grieve, Springfield, VA (US)

(73) Assignee: Creative Electron, Inc., Carlsbad, CA (US)

( * ) Notice: Subject to any disclaimer, the term of this patent is extended or adjusted under 35 U.S.C. 154(b) by 316 days.

(21) Appl. No.: 12/071,280

(22) Filed: Feb. 19, 2008

(65) Prior Publication Data

US 2008/0207814 A1 Aug. 28, 2008

Related U.S. Application Data

(63) Continuation-in-part of application No. 10/550,408, filed as application No. PCT/US2004/009886 on Mar. 30, 2004, now abandoned.

(60) Provisional application No. 60/458,944, filed on Apr. 1, 2003, provisional application No. 60/902,057, filed on Feb. 20, 2007.

(51) Int. Cl.
*C08K 3/08* (2006.01)
*C08L 63/02* (2006.01)

(52) U.S. Cl. .................. 523/459; 523/457; 523/458; 523/460; 525/533

(58) Field of Classification Search .................. None
See application file for complete search history.

(56) References Cited

U.S. PATENT DOCUMENTS 5,985,456 A * 11/1999 Zhou et al. .................. 428/414
6,610,759 B1 * 8/2003 Chappelow et al. ........... 522/25

OTHER PUBLICATIONS

CAS registry No. 25190-06-1 for polytetrahydrofuran, 1967, one page.*

* cited by examiner

*Primary Examiner*—Robert Sellers
(74) *Attorney, Agent, or Firm*—The Nath Law Group; Laurie A. Axford

(57) ABSTRACT

A thermally conductive adhesive composition includes a powder of a high melting point metal or metal alloy, a powder of a low melting point metal or metal alloy, and a polymerizable fluxing polymer matrix composition having a polyepoxide polymer resin and a low-melting solid or liquid acid-anhydride and a polymer diluent or diluents with carbon carbon double bonds and/or functional hydroxyl groups. The ratio by weight of the low melting point powder to high melting point powder ranges from about 0.50 to about 0.80, and may range from about 0.64 to about 0.75, and may be 0.665. Heretofore unpredicted substantially higher thermal conductivity improvements in performance have been found using these ratios of low melting point powder to high melting point powder.

12 Claims, No Drawings

THERMALLY CONDUCTIVE ADHESIVE COMPOSITION AND PROCESS FOR DEVICE ATTACHMENT

CROSS REFERENCE TO RELATED APPLICATIONS

This application is a continuation-in-part of U.S. patent application Ser. No. 10/550,408, filed Sep. 23, 2005, abandoned, which is an entry under 35 U.S.C. 371 of International Patent Application No. PCT/US04/09886 filed Mar. 30, 2004. Like International Patent Application No. PCT/US04/09886, the present application claims the benefit of U.S. Provisional Patent Application No. 60/458,944, filed Apr. 1, 2003. The present application also claims the benefit of U.S. Provisional Patent Application No. 60/902,057, filed Feb. 20, 2007. The contents of all of the above applications are hereby incorporated by reference in their entirety.

TECHNICAL FIELD OF THE INVENTION

The present subject matter relates to the use of conductive adhesives for fabrication of electronic assemblies. More specifically it relates to materials, methods and assemblies for the fabrication of electronics containing devices requiring thermal dissipation for cooling. The present subject matter also relates to adhesives for semiconductor die attachment that provide improved thermal dissipation.

BACKGROUND OF THE INVENTION

In order for a thermally conductive adhesive composition to be useful in the manufacture of semiconductor devices, it should meet certain performance, reliability and manufacturing requirements dictated by the particular application. Such performance properties include strength of adhesion, coefficient of thermal expansion, flexibility, temperature stability, moisture resistance, electrical and thermal conductivity and the like. Thermal conductivity is of particular importance in the electronics industry. With the trend towards miniaturization coupled with higher operating frequencies, there are ever-increasing demands on engineers to remove heat from circuitry. The extraction of heat generated by components within a package is necessary to prevent those components from overheating. This is a larger problem for electronics containing high-power devices that can dissipate many watts of energy during normal operation.

In the prior art, die attachment adhesives generally comprised a silver flake or powder dispersed in a curable resin, such as an epoxy. However, such prior-art adhesives have thermal conductivities unsuitable for devices that dissipate large amounts of heat. Additionally, the prior art adhesives often have poor mechanical properties. Another disadvantage is that some prior art adhesives contain solvents to maintain low viscosity. During cure, such solvents have a propensity to form voids, requiring a long bake-out operation to drive off the solvent prior to cure. This adds time and cost to the overall cure process. Another shortcoming is that adhesives generally have unstable contact resistance after environmental aging. Heat and humidity also tends to reduce adhesion of conductive adhesives. Moisture absorption of conductive adhesives can lead to delamination failures during printed circuit assembly.

Few prior-art die attachment adhesives have the thermal conductivity suitable for use with high power devices. As a result, solder bonding is often the selected method. Solders have the advantage of having many times the thermal conductivity of most die attachment adhesives. Solders also have the advantage of the solder forming intimate metallurgical bonds with the devices being soldered. A metallurgical interface provides superior heat transfer compared to the typical adhesive interface.

However, solder bonding has a number of disadvantages. Solder preforms are usually employed to dispense solder between devices to be bonded, which are more expensive to apply during production than adhesive pastes. Another difficulty is that solder remelts if heated to an elevated temperature, yet elevated temperatures are required during electronic fabrication, e.g. during assembly of components to printed circuit boards. Such remelting of solder between components in a circuit can cause the parts to separate and subsequently fail.

Art related to adhesives is found in U.S. Pat. Nos. 6,613,123, 6,528,169, 6,238,599, 6,140,402, 6,132,646, 6,114,413, 6,017,634, 5,985,456, 5,985,043, 5,928,404, 5,830,389, 5,713,508, 5,488,082, 5,475,048, 5,376,403, 5,285,417, 5,136,365, 5,116,433, 5,062,896, and 5,043,102. Representative art directed to die attachment is found in U.S. Pat. Nos. 4,811,081, 4,906,596, 5,006,575, 5,250,600, 5,386,000, 5,399,907, 5,489,637, 5,973,052, 6,147,141, 6,242,513, and 6,351,340, and published PCT application WO 98/33645. The entire contents of all listed documents is hereby incorporated by reference.

There is clearly a need for a new composition that provides the best advantages of both solder and conductive adhesive. There is a need for a conductive adhesive that not only forms metallurgical bonds with the devices being bonded, but also provides significantly more thermal conductivity than is currently possible with silver powder-resin compositions while retaining high mechanical strength. Moreover, there is a need for a bonding material that hardens when used so that it does not remelt at elevated temperatures as well as possessing a high thermal conductivity, yet can be dispensed in paste form, without solvents, rather than preforms. Additionally, there is a need for a conductive adhesive that does not suffer delamination, reduced adhesion, or conductivity after aging, humidity exposure, etc.

BRIEF SUMMARY OF THE INVENTION

The present inventive subject matter relates to a thermally conductive adhesive composition comprising:
a powder of a high melting point metal or metal alloy;
a powder of a low melting point metal or metal alloy; and
a polymerizable fluxing polymer matrix composition comprising a polyepoxide polymer resin and a low-melting solid or liquid acid-anhydride, wherein the polymerizable fluxing polymer matrix composition further comprises:
(A) a polymer diluent with at least one carbon carbon double bond, and another polymer diluent with at least one functional hydroxyl group, or
(B) a polymer diluent with both at least one carbon-carbon double bond and at least one functional hydroxyl group.

In some aspects, the ratio by weight of the powder of the low melting point metal or metal alloy to the powder of the high melting point metal or metal alloy ranges from about 0.50 to about 0.80, and in some aspects the ratio is from about 0.64 to about 0.75, and in some aspects the ratio is 0.665. The applicants have found unexpectedly heretofore unpredicted substantially higher thermal conductivity improvements in performance using these ratios of low melting point powder to high melting point powder.

In some embodiments, the composition comprises 50%-60% by weight the powder of the high melting point metal or metal alloy, and 30%-40% by weight the powder of the low melting point metal or metal alloy.

In some embodiments, the acid-anhydride comprises at least one material selected from the group consisting of: tetrahydrophthalic anhydride, hexahydrophthalic anhydride, nadic methyl anhydride, 4-methylhexahydrophthalic anhydride, methyltetrahydrophthalic anhydride and mixtures thereof.

In some embodiments, the polymer diluent with at least one carbon carbon double bond comprises at least one material selected from the group consisting of: 1,6 hexanediol diacrylatel; 1,6-hexanediol dimethacrylate; tris[2-(acryloxy)ethyl]isocyanurate; trimethylolpropane trimethacrylate; ethoxylated bisphenol diacrylate and mixtures thereof.

In some embodiments, the polymer diluent with at least one functional hydroxyl group comprises at least one material selected from the group consisting of: triethylene glycol, glycerol, tri(propylene glycol)methyl ether, di(ethylene glycol)butyl ether.

In some embodiments, the polymerizable fluxing polymer matrix composition further comprises a source of radical initiators. In some embodiments, the source of radical initiators comprises at least one material selected from the group consisting of: azobiscyclohexane carbontrile, benzoyl peroxide, cumyl peroxide, 1,1'-azobis(cyclohexanecarbonitrile), 2,2'-azbbisisobutyronitrile, and mixtures thereof.

In some embodiments, the polymerizable fluxing polymer matrix composition further comprises an inerting agent. In some embodiments, the inerting agent comprises at least one material selected from the group consisting of bisphenol A diglycidyl ether, bisphenol F diglycidyl ether, 1,4-cyclohexanedimethanol diglycidyl ether, 3,4-epoxycyclohexylmethyl 3,4-epoxycyclohexaniecarboxylate, N,N-diglycidyl-4-glycidyl-oxyaniline, glycidyl phenyl ether, glycidyl 4-methoxyphenyl ether, epoxy propyl benzene and mixtures thereof.

In some embodiments, the polymerizable fluxing polymer matrix composition further comprises an amine curing additive.

In some embodiments, the powder of the high melting point metal or metal alloy comprises electronic grade copper. In some embodiments, the powder of the high melting point metal or metal alloy comprises a material selected from the group consisting of copper, silver, aluminum, nickel, gold, platinum, palladium, beryllium, rhodium, nickel, cobalt, iron, molybdenum and alloys and mixtures thereof.

In some embodiments, the powder of the low melting point metal or metal alloy comprises a material selected from the group consisting of Sn, Bi, Pb, Cd, Zn, In, Te, Tl, Sb, Se, Ag, and alloys and mixtures thereof.

In some embodiments, the polymerizable fluxing polymer matrix composition further comprises a polymerizable fluxing agent represented by the formula RCOOH, wherein R comprises a moiety having one or more polymerizable carbon-carbon double bonds. In some embodiments, the polymerizable fluxing agent comprises a material selected from the group consisting of 2-(methacryloyloxy)ethyl succinate, mono-2-(methacryloyloxy)ethyl maleate, mono-2-(methacryloyloxy)ethyl phthalate, mono-2-(acryloyloxy)ethyl succinate and mixtures thereof.

In some embodiments, the polymer diluent with at least one functional hydroxyl group is present in sufficient amount to catalyze esterification of the acid anhydride so as to produce a polymerizable fluxing agent during heating of the conductive adhesive. In some embodiments, the polymer diluent with at least one functional hydroxyl group is present in sufficient amount to aid in spreading or wetting of the polymerizable fluxing polymer matrix during heating of the conductive adhesive.

The present inventive subject matter is also drawn to an electronic assembly comprising an electronic device and either
(i) a substrate bonded to the electronic device by a sintered thermally conductive adhesive; or
(ii) a substrate bonded to a heat spreading shim, where both the substrate and shim are bonded to each other and to the electronic device by a sintered thermally conductive adhesive composition.

The sintered thermally conductive adhesive comprises:
a powder of a high melting point metal or metal alloy;
a powder of a low melting point metal or metal alloy; and
a polymerizable fluxing polymer matrix composition comprising a polyepoxide polymer resin and a low-melting solid or liquid acid-anhydride, wherein the polymerizable fluxing polymer matrix composition further comprises:
(A) a polymer diluent with at least one carbon carbon double bond, and another polymer diluent with at least one functional hydroxyl group, or
(B) a polymer diluent with both at least one carbon-carbon double bond and at least one functional hydroxyl group.

Again, in some aspects of these assemblies, the ratio by weight of the powder of the low melting point metal or metal alloy to the powder of the high melting point metal or metal alloy ranges from about 0.50 to about 0.80, and in some aspects the ratio ranges from about 0.64 to about 0.75, and in some aspects the ratio is 0.665. The applicants have found unexpectedly heretofore unpredicted substantially higher thermal conductivity improvements in performance using these ratios of low melting point powder to high melting point powder.

In some embodiments, the acid-anhydride comprises at least one material selected from the group consisting of: tetrahydrophthalic anhydride, hexahydrophthalic anhydride, nadic methyl anhydride, 4-methylhexahydrophthalic anhydride, methyltetrahydrophthalic anhydride and mixtures thereof.

In some embodiments, the polymer diluent with at least one carbon carbon double bond comprises at least one material selected from the group consisting of: 1,6 hexanediol diacrylatel; 1,6-hexanediol dimethacrylate; tris[2-(acryloxy)ethyl]isocyanurate; trimethylolpropane trimethacrylate; ethoxylated bisphenol diacrylate and mixtures thereof.

In some embodiments, the polymer diluent with at least one functional hydroxyl group comprises at least one material selected from the group consisting of: triethylene glycol, glycerol, tri(propylene glycol)methyl ether, di(ethylene glycol)butyl ether.

In some embodiments, composition further comprises a source of radical initiators. In some embodiments, the source of radical initiators comprises at least one material selected from the group consisting of: azobiscyclohexane carbontrile, benzoyl peroxide, cumyl peroxide, 1,1'-azobis(cyclohexanecarbonitrile), 2,2'-azbbisisobutyronitrile, and mixtures thereof.

In some embodiments, the polymerizable fluxing polymer matrix composition further comprises an inerting agent. In some embodiments, the inerting agent comprises at least one material selected from the group consisting of bisphenol A diglycidyl ether, bisphenol F diglycidyl ether, 1,4-cyclohexanedimethanol diglycidyl ether, 3,4-epoxycyclohexylmethyl 3,4-epoxycyclohexaniecarboxylate, N,N-diglycidyl-4-glycidyl-oxyaniline, glycidyl phenyl ether, glycidyl 4-methoxyphenyl ether, epoxy propyl benzene and mixtures thereof.

In some embodiments, the polymerizable fluxing polymer matrix composition further comprises an amine curing additive.

In some embodiments, the powder of the high melting point metal or metal alloy comprises electronic grade copper. In some embodiments, the powder of the high melting point metal or metal alloy comprises a material selected from the group consisting of copper, silver, aluminum, nickel, gold, platinum, palladium, beryllium, rhodium, nickel, cobalt, iron, molybdenum and alloys and mixtures thereof.

In some embodiments, the powder of the low melting point metal or metal alloy comprises a material selected from the group consisting of Sn, Bi, Pb, Cd, Zn, In, Te, Tl, Sb, Se, Ag, and alloys and mixtures thereof.

In some embodiments, the polymerizable fluxing polymer matrix composition further comprises a polymerizable fluxing agent represented by the formula RCOOH wherein R comprises a moiety having one or more polymerizable carbon-carbon double bonds. In some embodiments, the polymerizable fluxing agent comprises a material selected from the group consisting of 2-(methacryloyloxy)ethyl succinate, mono-2-(methacryloyloxy)ethyl maleate, mono-2-(methacryloyloxy)ethyl phthalate, mono-2-(acryloyloxy)ethyl succinate and mixtures thereof.

In some embodiments, the polymer diluent with at least one functional hydroxyl group is present in sufficient amount to catalyze esterification of the acid anhydride so as to produce a polymerizable fluxing agent during heating of the conductive adhesive. In some embodiments, the polymer diluent with at least one functional hydroxyl group is present in sufficient amount to aid in spreading or wetting of the polymerizable fluxing polymer matrix during heating of the conductive adhesive.

Furthermore, the present inventive subject matter is directed to a method of attaching an electronic device to a substrate comprising the steps of:

obtaining an electronic device with at least one bondable surface;

obtaining a substrate with a corresponding bondable surface; and optionally obtaining a heat spreading shim with two bondable surfaces;

dispensing a thermally conductive adhesive on each bondable surface of the substrate, electronic device, and optionally, the heat spreading shim, said thermally conductive adhesive composition comprising:

a powder of a high melting point metal or metal alloy;

a powder of a low melting point metal or metal alloy; and a polymerizable fluxing polymer matrix composition comprising a polyepoxide polymer resin and a low-melting solid or liquid acid-anhydride, wherein the polymerizable fluxing polymer matrix composition further comprises:

(A) a polymer diluent with at least one carbon carbon double bond, and another polymer diluent with at least one functional hydroxyl group, or (B) a polymer diluent with both at least one carbon-carbon double bond and at least one functional hydroxyl group;

placing the electronic device on the substrate which may be bonded to a heat spreading shim so the bondable surface of both the electronic device and/or the heat spreading shim is mated with the bonding surface of the substrate, thereby forming a combined assembly;

heating the combined assembly to an elevated temperature, thereby causing the powder of the low melting point metal or metal alloy to liquefy;

allowing the liquefied low melting point metal or metal alloy to sinter with the high melting point metal or metal alloy; and simultaneously polymerizing the fluxing matrix rendering the fluxing matrix inert; and allowing the assembly to cool.

In some aspects of this method, the ratio by weight of the powder of the low melting point metal or metal alloy to the powder of the high melting point metal or metal alloy ranges from about 0.50 to about 0.80, and in some aspects the ratio ranges from about 0.64 to about 0.75, and in some aspects the ratio is 0.665. The applicants have found unexpectedly heretofore unpredicted substantially higher thermal conductivity improvements in performance using these ratios of low melting point powder to high melting point powder.

In some embodiments, the acid-anhydride comprises at least one material selected from the group consisting of: tetrahydrophthalic anhydride, hexahydrophthalic anhydride, nadic methyl anhydride, 4-methylhexahydrophthalic anhydride, methyltetrahydrophthalic anhydride and mixtures thereof.

In some embodiments, the polymer diluent with at least one carbon carbon double bond comprises at least one material selected from the group consisting of: 1,6 hexanediol diacrylatel; 1,6-hexanediol dimethacrylate; tris[2-(acryloxy) ethyl]isocyanurate; trimethylolpropane trimethacrylate; ethoxylated bisphenol diacrylate and mixtures thereof.

In some embodiments, the polymer diluent with at least one functional hydroxyl group comprises at least one material selected from the group consisting of: triethylene glycol, glycerol, tri(propylene glycol)methyl ether, di(ethylene glycol)butyl ether.

In some embodiments, the polymerizable fluxing polymer matrix composition further comprises a source of radical initiators. In some embodiments, the source of radical initiators comprises at least one material selected from the group consisting of: azobiscyclohexane carbontrile, benzoyl peroxide, cumyl peroxide, 1,1'-azobis(cyclohexanecarbonitrile), 2,2'-azbbisisobutyronitrile, and mixtures thereof.

In some embodiments, the polymerizable fluxing polymer matrix composition further comprises an inerting agent. In some embodiments, the inerting agent comprises at least one material selected from the group consisting of bisphenol A diglycidyl ether, bisphenol F diglycidyl ether, 1,4-cyclohexanedimethanol diglycidyl ether, 3,4-epoxycyclohexylmethyl 3,4-epoxycyclohexaniecarboxylate, N,N-diglycidyl-4-glycidyl-oxyaniline, glycidyl phenyl ether, glycidyl 4-methoxyphenyl ether, epoxy propyl benzene and mixtures thereof.

In some embodiments, the polymerizable fluxing polymer matrix composition further comprises an amine curing additive.

In some embodiments, the powder of the high melting point metal or metal alloy comprises electronic grade copper. In some embodiments, the powder of the high melting point metal or metal alloy comprises a material selected from the group consisting of copper, silver, aluminum, nickel, gold, platinum, palladium, beryllium, rhodium, nickel, cobalt, iron, molybdenum and alloys and mixtures thereof.

In some embodiments, the powder of the low melting point metal or metal alloy comprises a material selected from the group consisting of Sn, Bi, Pb, Cd, Zn, In, Te, Tl, Sb, Se, Ag, and alloys and mixtures thereof.

In some embodiments, the polymerizable fluxing polymer matrix composition further comprises a polymerizable fluxing agent represented by the formula RCOOH wherein R comprises a moiety having one or more polymerizable carbon-carbon double bonds. In some embodiments, the polymerizable fluxing agent comprises a material selected from the group consisting of 2-(methacryloyloxy)ethyl succinate, mono-2-(methacryloyloxy)ethyl maleate, mono-2-(methacryloyloxy)ethyl phthalate, mono-2-(acryloyloxy)ethyl succinate and mixtures thereof.

In some embodiments, the polymer diluent with at least one functional hydroxyl group is present in sufficient amount to catalyze esterification of the acid anhydride so as to produce a polymerizable fluxing agent during heating of the conductive adhesive. In some embodiments, the polymer diluent with at least one functional hydroxyl group is present in sufficient amount to aid in spreading or wetting of the polymerizable fluxing polymer matrix during heating of the conductive adhesive.

In some embodiments, the method includes the step of catalyzing esterification of the acid anhydride by way of the polymer diluent with at least one functional hydroxyl group so as to produce a polymerizable fluxing agent during heating of the conductive adhesive.

DETAILED DESCRIPTION OF THE INVENTION

Unlike the prior art, the adhesive formulation of the present subject matter produces an unexpectedly and heretofore unpredicted substantially higher thermal conductivity within a narrow range of metallic loading levels. Ratios by weight of the powder of the low melting point metal or metal alloy to the powder of the high melting point metal or metal alloy ranges from about 0.64 to about 0.75, and significant and substantially higher thermal conductivity has been observed as a ratio of about 0.665. The applicants have found unexpectedly heretofore unpredicted substantially higher thermal conductivity improvements in performance using these ratios of low melting point powder to high melting point powder. In this sense, the adhesives bond similarly to prior-art solders used in die-attachment. The inventive adhesives comprise low melting point fillers that, when heated, first melt, then alloy with high melting point fillers, then harden. Thereafter the adhesives do not remelt if they are elevated to the temperature at which they first melted. The subject matter addresses many of the shortcomings of prior art solders and adhesives, providing an easily-processed, solvent-free adhesive capable of forming metallurgical joints similar to solder with unexpected heretofore unpredicted substantially higher thermal conductivity. The inventive compositions have the further advantage they may be used as a replacement for solder paste during surface mount (SMT) manufacturing. The subject matter further comprises an electronic assembly employing inventive adhesive compositions for improved thermal dissipation.

The compositions of the present subject matter are free of fugitive solvents and comprise
  a powder of a high melting point metal or metal alloy;
  a powder of a low melting point metal or metal alloy; and
  a polymerizable fluxing polymer matrix composition comprising a polyepoxide polymer resin and a low-melting solid or liquid acid-anhydride, wherein the polymerizable fluxing polymer matrix composition further comprises:
  (A) a polymer diluent with at least one carbon carbon double bond, and another polymer diluent with at least one functional hydroxyl group, or
  (B) a polymer diluent with both at least one carbon-carbon double bond and at least one functional hydroxyl group.

Sintering and curing of the inventive compositions are achieved by heating. When the compositions are heated to the liquidus or melting point of the low melting point component, the composition forms a transient liquid phase. Unlike the art taught by U.S. Pat. No. 6,613,123, the included thermally curable adhesive flux composition serves initially as a fluxing agent, facilitating the removal of oxides from the surfaces of the metal powders, and also facilitating wetting of metallic surfaces by the molten metals. As the heating process is continued, the liquid phase and the high melting point metals react and isothermally solidify through a process known in the art as liquid-phase sintering. The heating process also serves to neutralize the fluxing components in the resin so that the components become non-corrosive and chemically stable. Unlike compositions such as described in U.S. Pat. No. 5,376,403, this may occur before, during or after the sintering of the metals. After the sintering process occurs, the heat causes the thermally curable adhesive flux composition to polymerize, forming a hard intractable binder. Heating is done by either continuous reflow processes commonly used in soldering or by using simple isothermal processing methods.

Preferably, the primary fluxing agent in these compositions integrates within a single molecule carboxylic acid group that provides the fluxing action for the soldering process without need of corrosive ions or halogens, and can polymerize upon application of heat, to form a high-strength solid adhesive polymer. This is accomplished without generating gases, water, or other harmful by-products. An inerting or neutralizing agent may be included to react during heating with the flux acid groups and any flux residues. As a consequence, after the thermally curable adhesive composition is cured, the flux residues do not need to be washed away or removed since they are inert and non-corrosive.

Solvents are not required as the thermally curable adhesive flux composition itself can comprise a relatively low-viscosity liquid. By incorporating low-viscosity fluxing agents, resins and diluents, the thermally curable adhesive flux composition has sufficiently low viscosity to permit the incorporation of very high levels of conductive filler powders without the need to add solvents.

Adhesive compositions involving transient liquid phase sintering in the presence of a polymerizing flux are known in the prior art, for example U.S. Pat. No. 5,376,403. However, the prior art has been principally directed at electrically conductive adhesives with high electrical conductivity, e.g. electrically conductive traces for printed circuits, where creation of microvoids during curing is generally harmless. The use of such adhesives in high thermal conductivity applications, such as silicon die attachment, had been previously stymied by the microvoids created in the adhesives of the prior art during the curing process. Voids cause the bonds formed to weaken. Voids also reduce the thermal conductivity of the bonds.

It has been discovered that the voids are due to fugitive solvents in the adhesives of the prior art, e.g. butyl carbitol (see examples 1-16 of U.S. Pat. No. 5,376,403), which cannot completely bake out during curing. These fugitive solvents have been required in the prior art in order to make the prior art compositions completely sinter. However, in the instant subject matter, it is possible to produce transient liquid phase sintered adhesives without fugitive solvents. The elimination of the fugitive solvents produces bonds that are void-free. Thus, a practical method for bonding two parts by means of transient liquid phase sintered adhesives to establish improved thermal conductivity through the bond is achieved. In the instant subject matter, the inventors unexpectedly discovered unprecedented and significant increases in thermal conductivity within a narrow range of metallic loading levels.

1. Fluxing Agents

Fluxing agents normally comprise carboxylic acid moieties or precursors of such moieties. In some presently disclosed aspects, the flux comprises carboxylic acid moieties. The adhesion, mechanical integrity, and corrosion resistance achieved with these fluxing agents are superior to those achieved with some prior art polymer fluxing agents because there is no need to add aggressive fluxing activators. The fluxing agents can be fully crosslinked and all components chemically immobilized upon curing. Even the reaction by-products of flux deoxidization of the metals are chemically bound in the polymer matrix.

Carboxylic acids function well as fluxing agents to remove oxides from metals. In addition, carboxylic acids are also very effective crosslinking moieties when present in their reactive form in a fluxing composition containing a suitable thermosetting resin, such as an epoxy. For this reason, in the prior art, chemical protection of the carboxylic acid was essential to achieving stability and preventing premature reactions, as described in U.S. Pat. No. 5,376,403. Protection was achieved by binding the fluxing agent with a chemically- or thermally-triggered species so that it becomes reactive only at or near the time that the solder melts. However, with the fluxing agents of the instant subject matter, no such protection is necessary because the compositions do not cure significantly until the elevated temperature required for sintering is reached or exceeded. This results in a fluxing agent that can function at its full strength with the metal oxides to produce fluxing that is superior to any heretofore polymerizable fluxing agent. For die attachment adhesive applications, this allows the adhesive composition to produce sound and complete metallurgical bonds with the metallizations on the die and substrate before hardening. This leads to superior thermal conductivity through the bonds, not possible in the prior art.

In some embodiments, including examples 1, 3, 5, and 6 given below, no carboxyl fluxing agents are initially provided in preparation of the composition. Rather, carboxyl fluxing agents come into being at intermediary steps during heating and application of the composition, such as during esterification of a hexahydrophthalic anhydride. The esterification is catalyzed by hydroxyls present in the mixture, such as those provided by triethylene glycol, glycerol, tri(propylene glycol)methyl ether, or di(ethylene glycol)butyl ether, as non-limiting examples. Esterification is also catalyzed by carboxyl groups formed during the heating and application of the composition. In general, any carboxyl fluxing agent initially added to the composition can serve as a catalyst for these reaction. In addition, tri(propylene glycol)methyl ether, or di(ethylene glycol)butyl ether can also serve as flux carriers, aiding in flux spreading/wetting during a soldering process.

2. Inerting Agents

An inerting or neutralizing agent is added to the inventive compositions to react with carboxylic acid present in the mixture after the fluxing action is completed, thereby eliminating the need for additional cleaning to remove potentially corrosive residues. Epoxides are particularly suitable for this purpose, though others, such as cyanate esters, can also neutralize the carboxylic acid function. The reaction between epoxides and carboxylic acids is well known to those skilled in the art. To ensure complete neutralization, a stoichiometric equivalent or excess of non-fluxing epoxide may be present. The inerting agent is optionally miscible with the fluxing agent and with other components in the composition. It can be mono-functional or multi functional, liquid or solid. Non-limiting examples of inerting agents include one or more components selected from the group comprising bisphenol A diglycidyl ether, bisphenol F diglycidyl ether, 1,4-cyclohexanedimethanol diglycidyl ether, 3,4-epoxycyclohexylmethyl 3,4-epoxycyclohexanecarboxylate, N,N-diglycidyl-4-glycidyl-oxyaniline, glycidyl phenyl ether, glycidyl 4-methoxyphenyl ether, epoxy propyl benzene and mixtures thereof. These are all commercially available.

The inerting agent concentration in the inventive flux may be stoichiometric, or somewhat in excess of stoichiometric, with the carboxylic acid component, in order to inert all of the acid during curing of the inventive conductive adhesives. Too high a concentration of inerting agent may cause excessive polymerization, which will limit sintering of the metals, whereas too low a concentration may leave unreacted pendant acid groups after cure, which are corrosive.

3. Resins

The thermally curable fluxing composition does not typically require additional non-fluxing or non-diluent resins. Compositions that do not include resins often have longer pot lives and lower viscosities during solder reflow. As a result, inclusion of a resin in the composition is not needed, except as an inerting agent. Resins, however, can also function to increase the adhesion of the cured composition to the substrate and to increase the cohesive strength and glass transition temperature of the cured composition. Thus, as an option, a resin can be employed so long as concentrations are kept relatively low. The resin may be any suitable resin that is blendable with the fluxing agent. By blendable is meant that the resins do not have to be chemically bonded to the fluxing agent and/or diluent. Preferred resins, though, can react with the carboxylic acid groups in the fluxing agent, inerting them, or by other reactive moieties, such as optional —OH groups, in the diluent.

Non-limiting examples of resins that meet these requirements include materials selected from the group comprising epoxies, phenolics, novalacs (both phenolic and cresolic), polyurethanes, polyimides, bismaleimides, maleimides, cyanate esters, polyvinyl alcohols, polyesters, and polyureas. Preferred resins include materials selected from the group comprising bisphenol A diglycidyl ether, bisphenol F diglycidyl ether, 1,4-cyclohexanedimethanol diglycidyl ether, 3,4-epoxycyclohexylmethyl 3,4-epoxycyclohexanecarboxylate, N,N-diglycidyl-4-glycidyl-oxyaniline, and mixtures thereof. These are commercially available.

It is also beneficial to include crosslinking agents when resins are used in the inventive compositions. Crosslinking agents are well established in the prior art. Examples of crosslinking agents include anhydrides and carboxyl-functionalized polyesters. The addition of such materials facilitates the crosslinking reaction of the resin. Examples of suitable anhydride crosslinking agents include one or more components selected from the group of, but not limited to tetrahydroplithalic anhydride, hexahydro phthalic anhydride, nadic methyl anhydride, 4-methythexahydrophthalic anhydride, and methyltetrahydrophthalic anhydride. All are commercially available.

When crosslinking agents are used, it is also useful to add an accelerator to increase the rate of crosslinking during thermal cure. Examples of suitable accelerators include imidazole and its derivatives, dicyandiamide and biguanide derivatives as well as tertiary amines such as benzyldimethylamine or 1,8-diazabicyclo[5.4.0]undec-7-ene. Alternatively, transition metal acetylacetonates may also be used to accelerate the rate of reaction during thermal cure between epoxide resins and anhydride crosslinking agents. Non-limiting examples include one or more components selected from the group comprising copper (II) acetylacetonate, cobalt (III) acetylacetonate and manganese (II) acetylacetonate.

4. Diluents

The presence of carbon-carbon double bond(s) in the fluxing polymer matrix allows significant flexibility in the formulation of a flux composition with improved thermomechanical properties. This is achieved by the addition of double bond containing diluents that also crosslink with the flux to create a superior adhesive. This technique permits the design of fluxing adhesive compositions that attain high crosslink densities, which are desirable for good thermomechanical properties and good adhesion. Moreover, this is accomplished without the concern of premature crosslinking and reduced pot life associated with the prior art. Non-limiting examples of diluents include one or more components selected from the group comprising 1,6-hexanediol diacrylate, 1,6-hexanediol dimethacrylate, tris[2-(acryloxy)ethyl]isocyanurate, trimethylolpropane trimethacrylate, ethoxylated bisphenol diacrylate and mixtures thereof. Most di- and tri-functionalized acrylate resins with low viscosity, well known to those skilled in the art, are suitable for this purpose Other double bond containing compounds, many of which are commercially available, including, for example, diallyl phthalate and divinyl benzene can also be used. Hydrophobic diluents as described may be used but hydrophilic diluents can also be employed when appropriate.

A benefit of employing hydrophobic diluents is that their presence tends to reduce the amount of water that the cured adhesive composition will absorb. The reason is that the fluxing agent, when crosslinked, will have active carboxylic groups that can attract water, even though these carboxylic groups, being part of a network, are immobile. Water acts as a plasticizer, which softens the cured adhesive composition. The use of hydrophobic diluents that are crosslinked to the fluxing agent will counteract the hydrophilic effects of the carboxylic acid groups.

In some embodiments, two or more polymer diluents are used, where some of the polymer diluents have at least one carbon carbon double bond, while others of the polymer diluents have at least one functional hydroxyl group. In other embodiments, at least one polymer diluent is used which has both at least one carbon-carbon double bond and at least one functional hydroxyl group.

5. Radical Initiators

While the thermally curable adhesive composition can be cured using heat alone, the cross linking reaction can be initiated and facilitated by the presence of free-radicals, including, for example, those generated by initiators such as benzoyl peroxide, cumyl peroxide, 1,1'-azobis(cyclohexanecarbonitrile), 2,2'-azobisisobutyronitrile, and mixtures thereof. These free radical initiators or sources are commercially available. In the presence of certain metals, such as copper, premature decomposition of peroxy initiators may occur due to unfavorable redox reactions resulting in outgassing and voids in the cured composition. Therefore, in one aspect, azo-type initiators are used.

Free-radicals are created in-situ by exposure of the free-radical initiator to heat, radiation, or other conventional energizing sources. Introduction of an appropriate free-radical initiator accelerates the onset of crosslinking to the desired moment in a solder reflow or isothermal curing operation. The presence of a small amount of free-radical crosslinking initiator in the fluxing agent is used to control the rate and the temperature of crosslinking of the fluxing agent, ensuring effective fluxing action and strong adhesion of the composition to the substrates upon curing.

In preparing the thermally curable adhesive flux composition, the proportions of each of the components may be varied over a considerable range and still yield acceptable fluxing activity as well as good post cured material properties. Optionally, the thermally curable adhesive flux composition employed does not produce gaseous byproducts that result in the formation of bubbles in the final cured composition.

In an aspect, the thermally curable polymeric fluxing composition, after being cured, has a glass transition temperature in excess of 100° C., a relatively low coefficient of thermal expansion (100 ppm/° C. or less) and moisture uptake of less than 3%. While, again, some of the fluxing agents within these ranges exhibit high coefficient of thermal expansion or low glass transition temperature when cured, the compositions remain useful as fluxing resins in applications where these characteristics are not critical.

Metal Powders

The inventive adhesive compositions comprise a blend of high melting point and low melting point metal or alloy powders. The powders can comprise round particles or flakes. The metal powders should comprise a range of sizes to improve packing density. In some adhesive compositions, the round particles have a maximum size of about 100 microns and could be less than about 50 microns in size. Flakes may also range from about 1 to about 50 microns in size. The use of flakes below about 30 microns is advantageous to prevent the texture of the adhesive composition from becoming too coarse. These are non-limiting examples, and other sizes may be used. Though it is well known that oxide removal from fine metal powders is more difficult due to the higher surface area, the fluxing activity of the inventive compositions can be sufficiently high to provide satisfactory oxide removal.

Any solderable or alloyable metal, alloy or metal mixture is usable as the high melting point powder. For example, the high melting point metal powder may be a material selected from the group comprising copper, silver, aluminum, nickel, gold, platinum, palladium, beryllium, rhodium, nickel, cobalt, iron, molybdenum and alloys or mixtures thereof. In particular, the high melting point metals may be copper, silver, nickel and/or gold. When spherical powders are used, the powders can have smooth, even morphology, as is typically produced using gas atomization methods. The high melting point powder can be comprised of a mixture of spherical powder and flake. The use of spherical powders permits a high metal loading in the adhesive composition, which is desirable for high thermal and electrical conductivity, while the addition of flake helps improve the rheology of the adhesive and facilitates application or dispensing using conventional equipment used in the fabrication of electronic assemblies. It also serves to prevent settling of the filler particles in the resin, maintaining the homogeneous nature of the material eliminating the need to re-mix the material prior to use. The high melting point powder makes up about 10-90% by weight of the total powder composition in an embodiment. In other aspects, the high melting point powder makes up about 50-60% by weight of the total powder composition.

Any solderable or alloyable metal, alloy or metal mixture is usable as the low melting point metal so long as it has a melting point well below that of the high melting point powder. The melting point of the low melting point powder is generally about 50° C. or more below the melting point of the high melting point powder. Alternatively, the melting point is about 100° C. or more below the melting point of the high melting point powder. These are merely examples, and other temperature differences may be selected. The low melting point metal powder can comprise one or more elements selected from the group comprising Sn, Bi, Pb, Cd, Zn, In, Te, Tl, Sb, Se, Ag, and alloys, or mixtures thereof. These mixtures can include, but are in no way limited to, SnInAg and SnBiAg. In a particular embodiment, the low melting point powder can comprise a commercial solder powder prepared from a combination of the metals Sn and Pb. The low melting point powder may have a liquidus temperature below 200° C. such that it melts prior to the hardening or curing of the polymeric fluxing agent. Typically, the solder powders used have particles sizes from about 1 to about 100 microns. This is merely an example, however, and other sizes may be used. Commonly, the solder powders comprise a combination of type 3, type 4 and type 5 (15-45 microns) size distribution. The low melting point powder makes up about 10-90% by weight of the adhesive powder mixture. In some aspects, the low melting point powder makes up about 30-40% by weight of the total powder composition.

In a particular aspect of the present subject matter, the metal powder used as the high melting point metal is electronic grade copper metal. In this aspect, the high melting point electronic grade copper may be supplied by Ultrafine Powders, Inc. of Woonsocket R.I., lot 04-277 and other lots.

In a particular aspect of the present subject matter, the ratio by weight of the powder of the low melting point metal or metal alloy to the powder of the high melting point metal or metal alloy ranges from about 0.50 to about 0.80, and in some aspects the ratio ranges from about 0.64 to about 0.75, and in some aspects the ratio is 0.665. The applicants have found unexpectedly heretofore unpredicted substantially higher thermal conductivity improvements in performance using these ratios of low melting point powder to high melting point powder.

Preparation of the Adhesive Compositions

In the preparation of the conductive adhesive composition, the low and high melting point metal powders are first blended to ensure a homogeneous mixture. With the metal powders, the blending may be performed in air at room temperature. Blending of the powders in an inert gas, such as nitrogen, is also possible to reduce the oxidation. Suitable methods of powder blending, such as shell blending, may also be used.

This powder mixture is then combined with the thermally curable adhesive flux composition. High shear mixing is useful to ensure homogeneity in the resulting paste. A method of high-shear blending known in the art is dual planetary mixing. The concentration of metal powder in the final adhesive can range from about 80-93% by weight, or 85-92% by weight, of the total adhesive composition, but these are a non-limiting examples and more or less metal powder may be used relative to the full composition. The remainder of the adhesive composition, which can range from about 7-20% by weight, or about 8-15% by weight, is comprised of the thermally curable adhesive flux composition, although again these are nonlimiting examples. These adhesive compositions are generally paste-like and are typically suitable for dispensing through a syringe using commercial dispensing equipment without the need for added solvent. Alternatively, the adhesive compositions may be suitable for application by stencil or screen printing techniques, well known to those skilled in the art.

Die Attachment

Though the thermally-curable adhesive compositions of the present subject matter have many uses, the adhesives are particularly well suited for attaching semiconductor die to substrates and optionally, heat spreading shims. In particular, the high thermal conductivity of the adhesives makes them well suited for bonding of semiconductor power devices to substrates and heat spreading shims. It is optional that the substrate, heat spreading shim and the die be metallized to allow the solder or low-melting point alloy to form metallurgical bonds. Such metallurgical bonds provide high strength and superior thermal and electrical conductivity.

In the prior art, semiconductor power devices are commonly bonded using solder. However, since the alloys employed in the inventive compositions have lower melting points than prior-art die attachment solders, an advantage of the inventive compositions is that metallurgical bond formation can occur at lower temperatures. Furthermore, the transient liquid phase sintering that occurs during heating results in high melting point alloys that melt at temperatures well above the original curing temperature. This advantage over prior art solders provides additional latitude in the temperatures used to perform subsequent electronic assembly. The heat applied during the transient liquid phase sintering operation also cures the polymer flux, forming a secondary high strength bond.

The thermally curable adhesive compositions of the present subject matter are also suitable for attaching semiconductor die to a substrate or optionally, heat spreading shims in situations where the die, the substrate or both have no metallization. In these instances, solder die attachment is not possible. Adhesion of the die to the substrate or shim is then due solely to the bonds formed by the polymeric component of the inventive adhesive, as is the case with prior art die attachment adhesives comprising a silver flake or powder dispersed in a curable resin. In these instances of the inventive die attachment processes, sintering occurs in the bulk of the disclosed adhesive, but no metallurgical bond formation occurs at the interfaces of the surfaces being joined. The efficiency of heat transfer through these interfaces is now reduced compared to metallized surfaces.

However, in these instances, the sintering that occurs in the bulk of the adhesive provides higher stability and thermal conductivity than typically found prior art die attachment adhesives. Prior art adhesives rely on point-to-point contact of the filler particles to provide thermal and electrical conductivity. With age, this point-to-point contact undergoes degradation, resulting in reduced thermal and electrical properties. Such degradation does not occur in the inventive compositions since the filler particles are effectively sintered together.

Method of Bonding

The present inventive subject matter is further directed toward a method of attaching an electronic device to a substrate which comprises the steps of: obtaining an electronic device, such as a silicon die, with at least one bondable surface; obtaining a substrate with a corresponding bondable surface; and optionally, obtaining a heat spreading shim with two bondable surfaces; dispensing the inventive thermally conductive adhesive on one or both of the bondable surface(s) of the substrate, shim, or electronic device; placing the electronic device on the substrate, or shim so the two bondable surfaces are mated, thereby forming a combined assembly; heating the combined assembly to an elevated temperature, causing the powder of the relatively low melting point metal or metal alloy to liquefy; allowing the liquefied low melting point metal or metal alloy to sinter with the relatively high melting point metal or metal alloy; polymerizing the fluxing matrix, thereby rendering the fluxing matrix inert; and allowing the assembly to cool.

A small amount of the presently disclosed composition is applied to the desired bonding area on the substrate, shim, or die using conventional syringe dispensing equipment, known to those skilled in the art. The adhesive is dispensed as a small dot or in any pattern. Alternately, the adhesive is stencil printed onto the parts using stencil printing equipment known in the art. Sufficient material is dispensed to ensure the formation of a small fillet of material around the edge of the die after placement. Using conventional die placement equipment, the die is then placed on the bonding area and pressed with sufficient force to ensure complete coverage of the underside of the die with the adhesive. The assembly is then heated in an oven. An isothermal oven may be used, but alternatively, a multizone solder reflow oven may be employed. In either case, for sintering to occur, the assembly should reach the melt or liquidus temperature of the low melting point alloy before the thermally curable adhesive flux composition hardens. In some inventive adhesive compositions, multiple passes through a reflow oven may be needed to complete the sintering process.

The following examples are illustrative of embodiments of the subject matter and are not to be construed as limiting the subject matter thereto. All percentages are given in weight percent, unless otherwise noted and equal a total of 100%.

Example 1

Die Attachment Composition

| Components | Amt | wt % |
|---|---|---|
| Copper Powder | 12.00000 | 54.496% |
| Tin-Lead Eutectic Powder | 7.98000 | 36.240% |
| Bisphenol A Digylcidyl Ether | 0.96088 | 4.364% |
| Hexahydrophthalic Anhydride | 0.76219 | 3.461% |
| Triethylene Glycol | 0.08143 | 0.370% |
| 1,6 Hexanediol Diacrylate | 0.23452 | 1.065% |
| Azobiscyclohexanecarbontrile | 0.00098 | 0.004% |

Hexahydrophthalic anhydride was dissolved in Bisphenol A diglycidyl ether by warming the mixture to 65° C. After stirring to form a homogeneous mixture, the blend was cooled to room temperature. 1,6-hexanediol diacrylate, triethylene glycol and azo biscyclohexanecarbontrile were then added with stirring to complete the polymer flux component of the adhesive composition. In a separate container, copper powder and 63Sn37Pb solder powder were mixed, using a hand blender. The copper powder was supplied by Ultrafine Powders, Inc. of Woonsocket, R.I., lot number 04-277. This mixture of metal powders was then added to the polymer flux. Homogeneity was achieved by high shear mixing in a mechanical blender. Finally, the mixture was degassed under high vacuum.

The composition was dispensed into a Teflon mold and passed through a 5 minute solder reflow cycle having a peak temperature of 210° C., followed by a post cure at 200° C. for 20 minutes. Bulk thermal conductivity of the sample had a conductivity of: 43.24 W/m K.

Example 2

Die Attachment Composition

| Components | Amt | wt % |
|---|---|---|
| Copper Powder | 12.00000 | 54.443% |
| Tin-Lead Eutectic Powder | 7.98000 | 36.205% |
| Bisphenol A Digylcidyl Ether | 0.92333 | 4.189% |
| Hexahydrophthalic Anhydride | 0.81253 | 3.686% |
| Triethylene Glycol | 0.07787 | 0.353% |
| 1,6 Hexanediol Diacrylate | 0.22535 | 1.022% |
| mono-2-(methacryloyloxy) ethyl maleate | 0.02124 | 0.096% |
| Azobiscyclohexanecarbontrile | 0.00092 | 0.004% |

Hexahydrophthalic anhydride was dissolved in Bisphenol A diglycidyl ether by warming the mixture to 65° C. After stirring to form a homogeneous mixture, the blend was cooled to room temperature. 1,6-hexanediol diacrylate, triethyline glycol, mono-2-(methacryloyloxy)ethyl maleate, and azo biscyclohexanecarbontrile were then added with stirring to complete the polymer flux component of the adhesive composition. In a separate container, copper powder and 63Sn37Pb solder powder were mixed, using a hand blender. The copper powder was supplied by Ultrafine Powders, Inc. of Woonsocket, R.I., lot number 04-277. This mixture of metal powders was then added to the polymer flux. Homogeneity was achieved by high shear mixing in a mechanical blender. Finally, the mixture was degassed under high vacuum.

The composition was dispensed into a Teflon mold and passed through a 5 minute solder reflow cycle having a peak temperature of 210° C., followed by a post cure at 200° C. for 20 minutes. Bulk thermal conductivity of the sample had a conductivity of: 40.954 W/m K.

Example 3

Comparative Die Attachment Composition

| Components | Amt | wt % |
|---|---|---|
| Copper Powder | 12.0000 | 54.496% |
| Tin-Lead Eutectic Powder | 7.98000 | 36.240% |
| Bisphenol A Digylcidyl Ether | 0.98411 | 4.469% |
| Hexahydrophthalic Anhydride | 0.78061 | 3.545% |
| Glycerol | 0.03409 | 0.155% |
| 1,6 Hexanediol Diacrylate | 0.24019 | 1.091% |
| Azobiscyclohexanecarbontrile | 0.00100 | 0.005% |

Hexahydrophthalic anhydride was dissolved in Bisphenol A diglycidyl ether by warming the mixture to 65° C. After stirring to form a homogeneous mixture, the blend was cooled to room temperature. Glycerol, 1,6-hexanediol diacrylate and azo biscyclohexanecarbontrile were then added with stirring to complete the polymer flux component of the adhesive composition. In a separate container, copper powder and 63Sn37Pb solder powder were mixed, using a hand blender. The copper powder was from lot number 04-277 from Ultrafine Powders, Inc. of Woonsocket, R.I. This mixture of metal powders was then added to the polymer flux. Homogeneity was achieved by high shear mixing in a mechanical blender. Finally, the mixture was degassed under high vacuum.

The composition was dispensed into a Teflon mold and passed through a 5 minute solder reflow cycle having a peak temperature of 210° C., followed by a post cure at 200° C. for 20 minutes. Bulk thermal conductivity of the sample had a conductivity of: 34.111 W/m K.

Example 4

Comparative Die Attachment Composition

| Components | Amt | wt % |
|---|---|---|
| Copper Powder | 12.00000 | 54.496% |
| Tin-Lead Eutectic Powder | 7.98000 | 36.240% |
| Bisphenol A Digylcidyl Ether | 0.93768 | 4.258% |
| Hexahydrophthalic Anhydride | 0.74378 | 3.378% |
| mono-2-(methacryloyloxy) ethyl maleate | 0.15893 | 0.722% |

-continued

| Components | Amt | wt % |
|---|---|---|
| poly(ethylene glycol) methacrylate | 0.19866 | 0.902% |
| Azobiscyclohexanecarbontrile | 0.00095 | 0.004% |

Hexahydrophthalic anhydride was dissolved in Bisphenol A diglycidyl ether by warming the mixture to 65° C. After stirring to form a homogeneous mixture, the blend was cooled to room temperature. mono-2-(methacryloyloxy)ethyl maleate, poly(ethylene glycol)methacrylate and azo biscyclohexanecarbontrile were then added with stirring to complete the polymer flux component of the adhesive composition. In a separate container, copper powder and 63Sn37Pb solder powder were mixed, using a hand blender. The copper powder was from lot number 04-277 from Ultrafine Powders, Inc. of Woonsocket, R.I. This mixture of metal powders was then added to the polymer flux. Homogeneity was achieved by high shear mixing in a mechanical blender. Finally, the mixture was degassed under high vacuum.

The composition was dispensed into a Teflon mold and passed through a 5 minute solder reflow cycle having a peak temperature of 210° C., followed by a post cure at 200° C. for 20 minutes. Bulk thermal conductivity of the sample had a conductivity of: 41.798 W/m K.

Example 5

Comparative Die Attachment Composition

| Components | Amt | wt % |
|---|---|---|
| Copper Powder | 12.00000 | 54.496% |
| Tin-Lead Eutectic Powder | 7.98000 | 36.240% |
| Bisphenol A Digylcidyl Ether | 0.89824 | 4.079% |
| Hexahydrophthalic Anhydride | 0.71250 | 3.236% |
| tri(propylene glycol) methyl ether | 0.20911 | 0.950% |
| 1,6 Hexanediol Diacrylate | 0.21923 | 0.996% |
| Azobiscyclohexanecarbontrile | 0.00091 | 0.004% |

Hexahydrophthalic anhydride was dissolved in Bisphenol A diglycidyl ether by warming the mixture to 65° C. After stirring to form a homogeneous mixture, the blend was cooled to room temperature. Tri(propylene glycol)methyl ether, 1,6 hexanediol diacrylate and azo biscyclohexanecarbontrile were then added with stirring to complete the polymer flux component of the adhesive composition. In a separate container, copper powder and 63Sn37Pb solder powder were mixed, using a hand blender. The copper powder was from lot number 04-277 from Ultrafine Powders, Inc. of Woonsocket, R.I. This mixture of metal powders was then added to the polymer flux. Homogeneity was achieved by high shear mixing in a mechanical blender. Finally, the mixture was degassed under high vacuum.

The composition was dispensed into a Teflon mold and passed through a 5 minute solder reflow cycle having a peak temperature of 210° C., followed by a post cure at 200° C. for 20 minutes. Bulk thermal conductivity of the sample had a conductivity of: 42.498 W/m K.

Example 6

Comparative Die Attachment Composition

| Components | Amt | wt % |
|---|---|---|
| Copper Powder | 12.00000 | 54.496% |
| Tin-Lead Eutectic Powder | 7.98000 | 36.240% |
| Bisphenol A Digylcidyl Ether | 0.91836 | 4.171% |
| Hexahydrophthalic Anhydride | 0.72846 | 3.308% |
| di(ethylene glycol) butyl ether | 0.16811 | 0.763% |
| 1,6 Hexanediol Diacrylate | 0.22414 | 1.018% |
| Azobiscyclohexanecarbontrile | 0.00093 | 0.004% |

Hexahydrophthalic anhydride was dissolved in Bisphenol A diglycidyl ether by warming the mixture to 65° C. After stirring to form a homogeneous mixture, the blend was cooled to room temperature. Di(ethylene glycol)butyl ether, 1,6 hexanediol diacrylate and azo biscyclohexanecarbontrile were then added with stirring to complete the polymer flux component of the adhesive composition. In a separate container, copper powder and 63Sn37Pb solder powder were mixed, using a hand blender. The copper powder was from lot number 04-277 from Ultrafine Powders, Inc. of Woonsocket, R.I. This mixture of metal powders was then added to the polymer flux. Homogeneity was achieved by high shear mixing in a mechanical blender. Finally, the mixture was degassed under high vacuum.

The composition was dispensed into a Teflon mold and passed through a 5 minute solder reflow cycle having a peak temperature of 210° C., followed by a post cure at 200° C. for 20 minutes. Bulk thermal conductivity of the sample had a conductivity of: 51.194 W/m K.

The composition labeled "Example 4" above is known by the applicants to have exceptional pot-life characteristics above those of the other disclosed compositions above. The composition of Example 4 was tested for viscosity on a Brookfield cone and plate viscometer and had a viscosity of about 100000 cps @1 rpm and 25 C. The composition was tested every two hours, and no discernable change in viscosity was found after 10 hours of testing. This differs from the other compositions, whose viscosity was found to double after approximately 2.5 hours at room-temperature.

The presently disclosed subject matter includes both lead-containing and lead-free bonding materials. Although a number of examples presented in this disclosure comprise lead, many conventional die attachment solders containing lead are now avoided due to environmental concerns. Typical lead-free solders, proposed as an alternative to conventional die attachment solders containing lead, have their own problems: they often require very high process temperatures that are often damaging to the assemblies themselves, and the solder tends to remelt if heated to an elevated temperature, such as the temperatures required during electronic fabrication, which can cause the bonded parts to separate and subsequently fail. Thus, the present disclosed subject matter proposes conductive adhesive materials which need not utilize lead but which in any case form metallurgical bonds with significant thermal conductivity and high mechanical strength, and which harden when used so as not to remelt at elevated temperatures. Lead-free bonding materials may require different ratios of low to high melting point metals than those disclosed above, including (but not limited to) ratios of about 0.9 to about 1; about 1 to about 1; and about 1.1 to about 1, although other ratios may be used.

The inventive subject matter being thus described, it will be obvious that the same may be varied in many ways. Such variations are not to be regarded as a departure from the spirit and scope of the inventive subject matter, and all such modifications are intended to be included within the scope of the following claims.

What is claimed is:

1. A thermally conductive adhesive composition comprising:
   a powder of a high melting point metal or metal alloy;
   a powder of a low melting point metal or metal alloy; and
   a polymerizable fluxing polymer matrix composition comprising a polyepoxide polymer resin and a low-melting solid or liquid acid-anhydride, wherein the polymerizable fluxing polymer matrix composition further comprises:
      a polymer diluent with at least one carbon carbon double bond; and
      a polymer diluent with at least one functional hydroxyl group comprising at least one material selected from the group consisting of: triethylene glycol, glycerol, tri(propylene glycol) methyl ether and di(ethylene glycol) butyl ether,
   wherein the ratio by weight of the powder of the low melting point metal or metal alloy to the powder of the high melting point metal or metal alloy ranges from about 0.50 to about 0.80.

2. The thermally conductive adhesive composition of claim 1, wherein the ratio by weight of the powder of the low melting point metal or metal alloy to the powder of the high melting point metal or metal alloy is about 0.665.

3. The thermally conductive adhesive composition of claim 1, wherein the composition comprises 50%-60% by weight the powder of the high melting point metal or metal alloy, and 30%-40% by weight the powder of the low melting point metal or metal alloy.

4. The thermally conductive adhesive composition of claim 1, wherein the acid-anhydride comprises at least one material selected from the group consisting of: tetrahydrophthalic anhydride, hexahydrophthalic anhydride, nadic methyl anhydride, 4-methylhexahydrophthalic anhydride, methyltetrahydrophthalic anhydride and mixtures thereof.

5. The thermally conductive adhesive composition of claim 1, wherein the polymer diluent with at least one carbon carbon double bond comprises at least one material selected from the group consisting of: 1,6 hexanediol diacrylate; 1,6-hexanediol dimethacrylate; tris[2-(acryloxy)ethyl]isocyanurate; trimethylolpropane trimethacrylate; ethoxylated bisphenol diacrylate and mixtures thereof.

6. The thermally conductive adhesive composition of claim 1, wherein the polymerizable fluxing polymer matrix composition further comprises:
   a source of radical initiators.

7. The thermally conductive adhesive composition of claim 6, wherein the source of radical initiators comprises at least one material selected from the group consisting of: azobiscyclohexane carbontrile, benzoyl peroxide, amyl peroxide, 1,1'-azobis(cyclohexanecarbonitrile), 2,2'-azbbisisobutyronitrile, and mixtures thereof.

8. The thermally conductive adhesive composition of claim 1, wherein the powder of the high melting point metal or metal alloy comprises electronic grade copper.

9. The thermally conductive adhesive composition of claim 1, wherein the powder of the high melting point metal or metal alloy comprises a material selected from the group consisting of copper, silver, aluminum, nickel, gold, platinum, palladium, beryllium, rhodium, nickel, cobalt, iron, molybdenum and alloys and mixtures thereof.

10. The thermally conductive adhesive composition of claim 1, wherein the powder of the low melting point metal or metal alloy comprises a material selected from the group consisting of Sn, Bi, Pb, Cd, Zn, In, Te, Tl, Sb, Se, Ag, and alloys and mixtures thereof.

11. The thermally conductive adhesive composition of claim 1, wherein the polymer diluent with at least one functional hydroxyl group is present in sufficient amount to catalyze esterification of the acid anhydride so as to produce a polymerizable fluxing agent during heating of the conductive adhesive.

12. The thermally conductive adhesive composition of claim 11, wherein the polymer diluent with at least one functional hydroxyl group is present in sufficient amount to aid in spreading or wetting of the polymerizable fluxing polymer matrix during heating of the conductive adhesive.

* * * * *